(12) United States Patent
Bateman et al.

(10) Patent No.: US 6,831,868 B2
(45) Date of Patent: Dec. 14, 2004

(54) BYTE ALIGNED REDUNDANCY FOR MEMORY ARRAY

(75) Inventors: Robert D. Bateman, Scottsdale, AZ (US); James R. Harness, Chandler, AZ (US); Kayla L. Chalmers, Austin, TX (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/310,287

(22) Filed: Dec. 5, 2002

(65) Prior Publication Data

US 2004/0109360 A1 Jun. 10, 2004

(51) Int. Cl.[7] .............................................. G11C 7/00
(52) U.S. Cl. ....................................... 365/200; 365/201
(58) Field of Search ................................ 365/200, 201, 365/189.01, 230.03

(56) References Cited

U.S. PATENT DOCUMENTS 6,172,916 B1 * 1/2001 Ooishi ................... 365/189.02
6,552,937 B2 * 4/2003 Ladner et al. ............... 365/200
6,704,226 B2 * 3/2004 Lee ............................. 365/200
6,728,910 B1 * 4/2004 Huang ......................... 714/711

* cited by examiner

*Primary Examiner*—Anh Phung
(74) *Attorney, Agent, or Firm*—Schwegman, Lundberg, Woessner & Kluth, P.A.

(57) ABSTRACT

A memory includes byte aligned column redundancy capabilities for use in repairing the memory when a defective column is present. The memory array includes a repair/redundant column for use in repairing the memory when another column of the memory array is defective. The memory also has a redundant write multiplexer to select, when a defective column is present in the memory array, an input data bit to be written to the redundant column. A first input of the redundant write multiplexer may be coupled to receive either the LSB or the MSB of write data associated with the first column group and a second input of the redundant write multiplexer may be coupled to receive either the LSB or the MSB of write data associated with the second column group.

18 Claims, 9 Drawing Sheets

Fig. 1

| REPAIR BK | BYTE[3] | | | | | | | | BYTE[2] | | | | | | | | BYTE[1] | | | | | | | | BYTE[0] | | | | | | | |
|---|---|---|---|---|---|---|---|---|---|---|---|---|---|---|---|---|---|---|---|---|---|---|---|---|---|---|---|---|---|---|---|---|
| | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| NONE | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 |
| 2 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 |
| 3 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 |
| 4 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 |
| 5 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| 6 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 |
| 7 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 |
| 8 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 9 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 1 | 1 | 1 | 1 | 1 | 1 | 1 | 1 |
| 10 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 1 | 1 | 1 | 1 | 1 | 1 | 1 | 1 |
| 11 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 1 | 1 | 1 | 1 | 1 | 1 | 1 | 1 |
| 12 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 1 | 1 | 1 | 1 | 1 | 1 | 1 | 1 |
| 13 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 1 | 1 | 1 | 1 | 1 | 1 | 1 | 1 |
| 14 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 1 | 1 | 1 | 1 | 1 | 1 | 1 | 1 |
| 15 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 16 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 |
| 17 | 1 | 1 | 1 | 1 | 1 | 1 | 1 | 1 | 1 | 1 | 1 | 1 | 1 | 1 | 0 | 0 | 1 | 1 | 1 | 1 | 1 | 1 | 1 | 1 | 1 | 1 | 1 | 1 | 1 | 1 | 1 | 1 |
| 18 | 1 | 1 | 1 | 1 | 1 | 1 | 1 | 1 | 1 | 1 | 1 | 1 | 1 | 0 | 0 | 0 | 1 | 1 | 1 | 1 | 1 | 1 | 1 | 1 | 1 | 1 | 1 | 1 | 1 | 1 | 1 | 1 |
| 19 | 1 | 1 | 1 | 1 | 1 | 1 | 1 | 1 | 1 | 1 | 1 | 1 | 0 | 0 | 0 | 0 | 1 | 1 | 1 | 1 | 1 | 1 | 1 | 1 | 1 | 1 | 1 | 1 | 1 | 1 | 1 | 1 |
| 20 | 1 | 1 | 1 | 1 | 1 | 1 | 1 | 1 | 1 | 1 | 1 | 0 | 0 | 0 | 0 | 0 | 1 | 1 | 1 | 1 | 1 | 1 | 1 | 1 | 1 | 1 | 1 | 1 | 1 | 1 | 1 | 1 |
| 21 | 1 | 1 | 1 | 1 | 1 | 1 | 1 | 1 | 1 | 1 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 22 | 1 | 1 | 1 | 1 | 1 | 1 | 1 | 1 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 23 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 24 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 25 | 1 | 1 | 1 | 1 | 1 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 26 | 1 | 1 | 1 | 1 | 1 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 27 | 1 | 1 | 1 | 1 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 28 | 1 | 1 | 1 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 29 | 1 | 1 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 30 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 31 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

| REPAIR BK | REDUNDANCY BITS 100 | | | | | | REPAIR VECTOR 102 | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|---|---|
| | 5 | 4 | 3 | 2 | 1 | 0 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| NONE | 0 | - | - | - | - | - | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 0 | 1 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 |
| 1 | 1 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 |
| 2 | 1 | 0 | 0 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 |
| 3 | 1 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 |
| 4 | 1 | 0 | 0 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 |
| 5 | 1 | 0 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| 6 | 1 | 0 | 0 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 |
| 7 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 |
| 8 | 1 | 0 | 1 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 |
| 9 | 1 | 0 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 1 | 1 | 1 | 1 | 1 | 1 | 1 | 1 |
| 10 | 1 | 0 | 1 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 1 | 1 | 1 | 1 | 1 | 1 | 1 | 1 |
| 11 | 1 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 1 | 1 | 1 | 1 | 1 | 1 | 1 | 1 |
| 12 | 1 | 0 | 1 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 1 | 1 | 1 | 1 | 1 | 1 | 1 | 1 |
| 13 | 1 | 0 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 1 | 1 | 1 | 1 | 1 | 1 | 1 | 1 |
| 14 | 1 | 0 | 1 | 1 | 1 | 0 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 1 | 1 | 1 | 1 | 1 | 1 | 1 | 1 |
| 15 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 16 | 1 | 1 | 0 | 0 | 0 | 0 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 |
| 17 | 1 | 1 | 0 | 0 | 0 | 1 | 1 | 1 | 1 | 1 | 1 | 1 | 1 | 1 | 1 | 1 | 1 | 1 | 1 | 1 | 0 | 0 | 1 | 1 | 1 | 1 | 1 | 1 | 1 | 1 | 1 | 1 | 1 | 1 | 1 | 1 | 1 | 1 |
| 18 | 1 | 1 | 0 | 0 | 1 | 0 | 1 | 1 | 1 | 1 | 1 | 1 | 1 | 1 | 1 | 1 | 1 | 1 | 1 | 0 | 0 | 0 | 1 | 1 | 1 | 1 | 1 | 1 | 1 | 1 | 1 | 1 | 1 | 1 | 1 | 1 | 1 | 1 |
| 19 | 1 | 1 | 0 | 0 | 1 | 1 | 1 | 1 | 1 | 1 | 1 | 1 | 1 | 1 | 1 | 1 | 1 | 1 | 0 | 0 | 0 | 0 | 1 | 1 | 1 | 1 | 1 | 1 | 1 | 1 | 1 | 1 | 1 | 1 | 1 | 1 | 1 | 1 |
| 20 | 1 | 1 | 0 | 1 | 0 | 0 | 1 | 1 | 1 | 1 | 1 | 1 | 1 | 1 | 1 | 1 | 1 | 0 | 0 | 0 | 0 | 0 | 1 | 1 | 1 | 1 | 1 | 1 | 1 | 1 | 1 | 1 | 1 | 1 | 1 | 1 | 1 | 1 |
| 21 | 1 | 1 | 0 | 1 | 0 | 1 | 1 | 1 | 1 | 1 | 1 | 1 | 1 | 1 | 1 | 1 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 22 | 1 | 1 | 0 | 1 | 1 | 0 | 1 | 1 | 1 | 1 | 1 | 1 | 1 | 1 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 23 | 1 | 1 | 0 | 1 | 1 | 1 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 24 | 1 | 1 | 1 | 0 | 0 | 0 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 25 | 1 | 1 | 1 | 0 | 0 | 1 | 1 | 1 | 1 | 1 | 1 | 1 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 26 | 1 | 1 | 1 | 0 | 1 | 0 | 1 | 1 | 1 | 1 | 1 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 27 | 1 | 1 | 1 | 0 | 1 | 1 | 1 | 1 | 1 | 1 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 28 | 1 | 1 | 1 | 1 | 0 | 0 | 1 | 1 | 1 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 29 | 1 | 1 | 1 | 1 | 0 | 1 | 1 | 1 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 30 | 1 | 1 | 1 | 1 | 1 | 0 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 31 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

BYTE ALIGNED REDUNDANCY FOR MEMORY ARRAY

BACKGROUND OF THE INVENTION

In semiconductor memories, a redundancy scheme is often employed that allows defective portions of a memory array to be effectively replaced using spare segments in the array. In this manner, manufacturing yields can be increased and overall manufacturing costs reduced. One redundancy scheme that is commonly employed is known as column redundancy. In a memory implementing column redundancy, a spare (or redundant) column is used to compensate for a defective column within an array. In one known column redundancy technique, data bits within a row of a memory array are shifted one bit position to the right (or left) from the location of a defective column to bypass the defective column. The least significant bit of the row is shifted into the redundant column of the memory array. Upon reading the data from the row, the displaced data bits are shifted back to their intended bit positions. This redundant shifting may be performed for a row in the corresponding memory array.

In a memory supporting byte access, an individual byte of data may be written to and/or read from a row of a memory array (the row being larger than a single byte) without accessing the entire row. In such memories, read and/or write controls are often implemented on a byte-by-byte basis. Redundant bit shifts that cross byte boundaries within the array can therefore require additional read and/or write controls to be generated during a byte access operation that would not normally be necessary, for example, a control to read a bit of data from or write a bit of data to an adjacent byte in a row of the array. The need to generate these additional controls adds complexity to the overall memory design and will typically require a significant increase in the amount of control logic and routing necessary to support redundancy within a memory.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
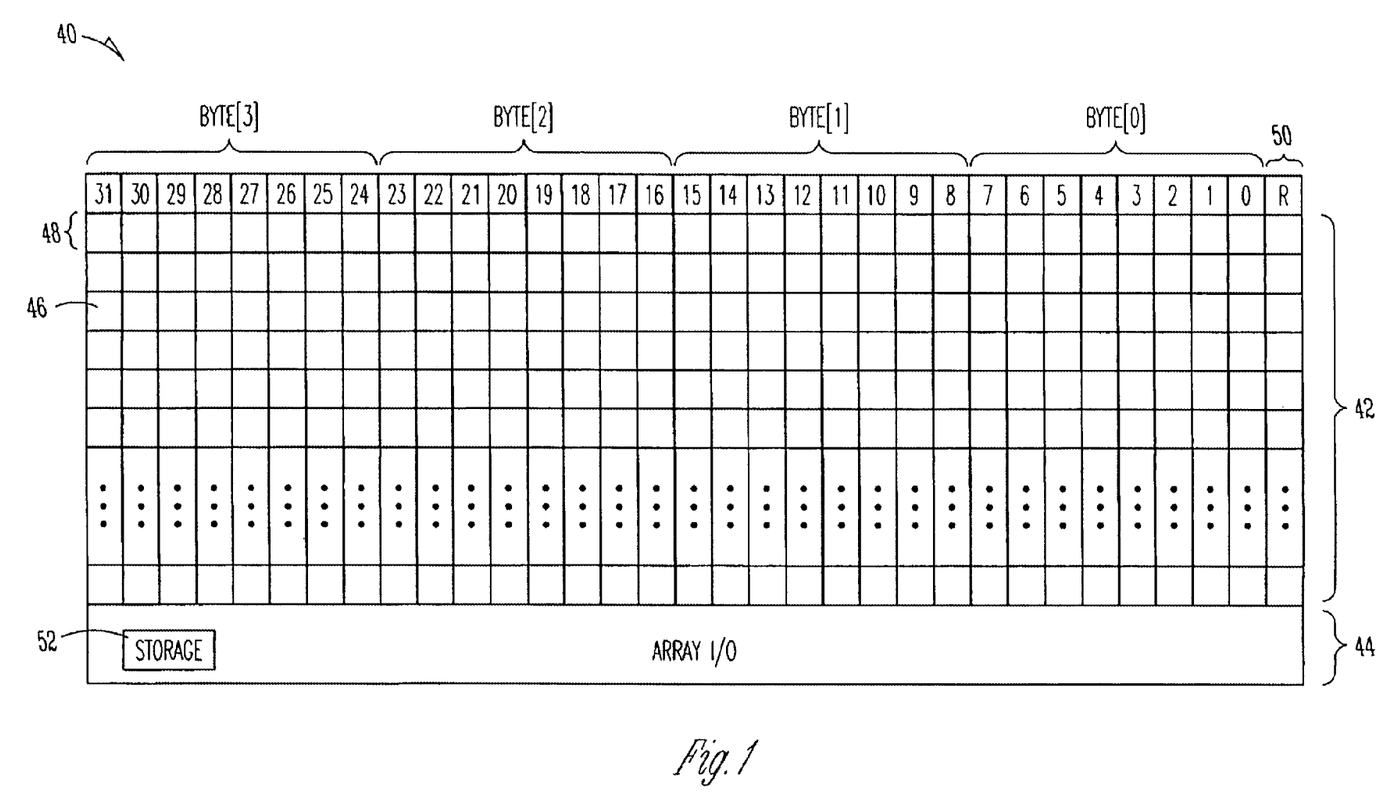
FIG. 1 is a diagram illustrating a memory in accordance with an embodiment of the present invention.

FIG. 1 is a diagram illustrating a memory 40 in accordance with an embodiment of the present invention. As illustrated, the memory 40 includes a memory array 42 and an array input/output (I/O) 44. The memory array 42 includes a number of memory cells 46, arranged in columns and rows that are operative for storing digital data within the memory 40. The array I/O 44 includes control functionality to facilitate the storage of data to and the retrieval of data from the memory array 42. A row 48 of the memory array 42 is capable of storing a digital data word having a predetermined length. In the illustrated embodiment, the memory array 42 includes 32 regular columns (labeled 0 through 31 in FIG. 1) and is thus capable of storing a 32-bit data word within a row 48. It should be appreciated, however, that the specific number of columns shown in FIG. 1 is not meant to be limiting. The memory array 42 also includes a redundant column 50 for use in repairing the memory 40 if one of the 32 regular columns is defective. Although located at the rightmost end of the memory array 42 in the illustrated embodiment, it should be appreciated that the redundant column 50 may be located in other positions within the memory array 42. Additional redundant columns may also be provided within the memory array 42 to allow the memory 40 to be repaired should two or more of the regular columns are defective. The control functionality for implementing the column redundancy may be located within, for example, the array I/O 44.

In at least one embodiment, the memory 40 is capable of supporting byte access. That is, the memory 40 is able to store and/or retrieve an individual byte, that is, namely, an 8-bit block, of data to/from a row 48 of the memory array 42 without having to access the entire row. As shown in FIG. 1, a first group of columns (columns 0–7) may be used to store a first byte of data (BYTE[0]) within a row 48, a second group of columns (columns 8–15) may be used to store a second byte of data (BYTE[1]) within a row, a third group of columns (columns 16–23) may be used to store a third byte of data (BYTE[2]), and a fourth group of columns (columns 24–31) may be used to store a fourth byte of data (BYTE[3]). Thus, if byte access is supported, the memory 40 may, for example, read and/or write BYTE[2] of a particular row 48 without reading and/or writing BYTE[0], BYTE[1], or BYTE[3] of the same row 48. As used herein, the term "least significant bit column" or "LSB column" in one or more embodiments, may refer to the column within a column group that would normally carry the least significant bit (LSB) of a corresponding data byte. Similarly, the term "most significant bit column" or "MSB column" in one or more embodiments, may refer to the column within a column group that would normally carry the most significant bit (MSB) of a corresponding data byte. In FIG. 1, the column groups that correspond to stored data bytes include a number of contiguous columns in the array 42. It should be appreciated that such column groups may alternatively include non-contiguous columns or a combination of contiguous and non-contiguous columns. Non-contiguous columns may be used, for example, in memories implementing bit interleaving.

In one aspect of the present invention, a redundant column is used to repair a memory having a defective column in a byte-aligned manner. That is, the redundant column is used to replace a column within the byte-aligned group of columns that also includes the defective column. For example, with reference to FIG. 1, if column 19 of memory array 42 is determined to be defective, the redundant column 50 may be used to replace a column in the group of columns associated with corresponding BYTE[2], that is, namely, columns 16–23. As will be described in greater detail, in at least one approach, the redundant column 50 is used to replace the LSB column within the appropriate group of columns, that is, namely, column 16 in the above example. Thus, if column 19 is defective, the bit that would have been stored in column 19 is instead stored in column 18, the bit that would have been stored in column 18 is instead stored in column 17, the bit that would have been stored in column 17 is instead stored in column 16, and the bit that would have been stored in column 16 (the LSB column) is instead stored in the redundant column 50. During a read of this data byte, the displaced data bits are shifted back into their appropriate bit positions with the data bit from the redundant column 50 being shifted into the LSB position of the read byte. By performing byte-aligned redundancy, redundant data shifts are confined within the byte boundaries established within the memory array. Thus, the additional controls that would otherwise be necessary to support redundant shifts across byte boundaries, for example, an additional bit write enable for an adjacent byte, are not needed. Although the embodiments of the present invention are described herein as shifting data from the LSB position, these embodiments of the present invention are equally applicable to shifting data from either the LSB or MSB position. In addition, other embodiments of the present invention may shift data from the MSB position.

Figure 2:
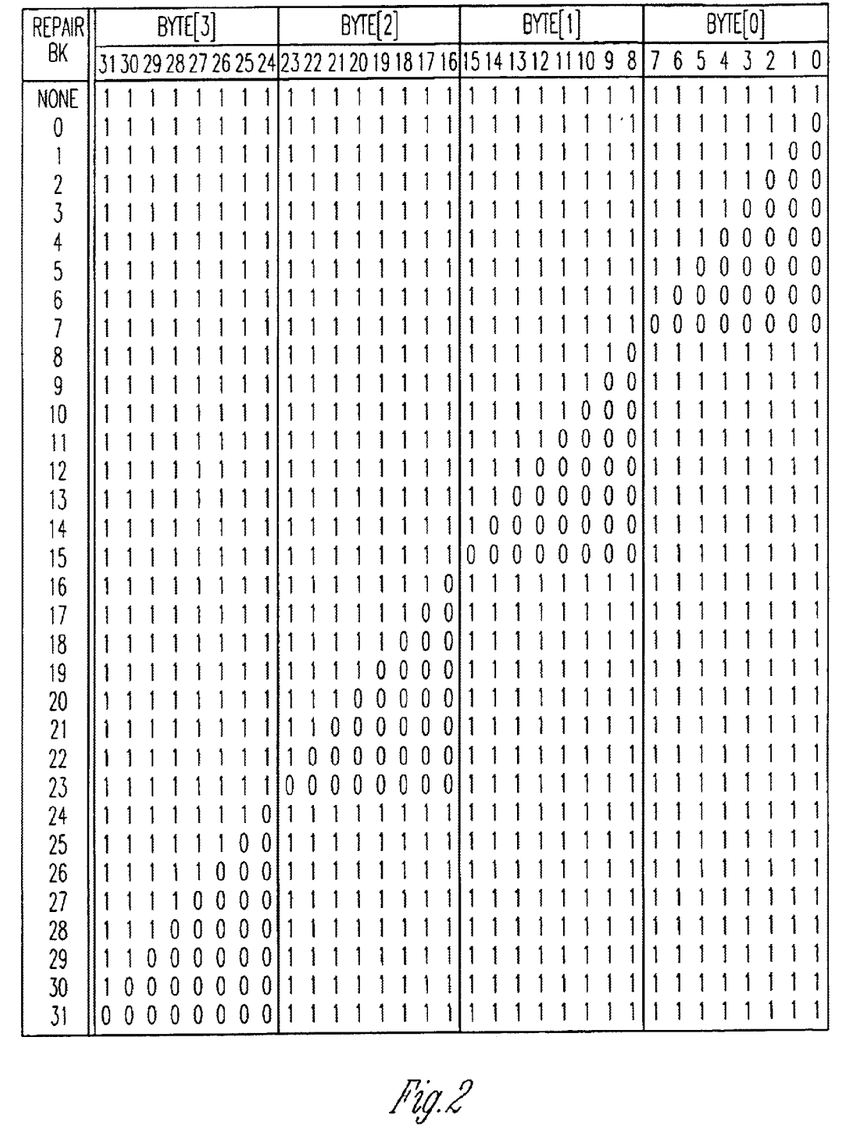
FIG. 2 is a table illustrating a family of repair vectors that may be used to implement byte-aligned redundancy in accordance with an embodiment of the present invention.

In at least one embodiment of the present invention, a repair vector is used within a memory, for example, memory 40 of FIG. 1, to implement byte-aligned redundancy. FIG. 2 is a table illustrating a family of repair vectors that may be used in connection with memory arrays that store 32-bit data words in accordance with an embodiment of the invention. Similar tables may be generated for arrays having other data word sizes. The table of FIG. 2 includes one repair vector for a possible location of a defective column in a corresponding 32-column memory array. For example, the repair vector corresponding to Repair Bit 0 in the table is for use with a memory having a defective column 0, the repair vector corresponding to Repair Bit 1 is for use with a memory having a defective column 1, and so on. A repair vector is also provided in the table for the situation where no columns are defective. In a repair vector, a value of "1" indicates that no redundant shift of data is to be performed for the corresponding column and a value of "0" indicates that a redundant shift is to be performed for the column. Once the repair vector for a memory is known, a read or write operation may be carried out as follows:

```
FOR non-LSB columns,
    IF RepairVector[i] = 1 THEN
        Data[i] = Column[i]        ; for reads
        Column[i] = Data[i]        ; for writes
    ELSE IF RepairVector[i] = 0 THEN
        Data[i] = Column[i-1]      ; for reads
        Column[i] = Data[i+1]      ; for writes
FOR LSB columns,
    IF RepairVector[i] = 1 THEN
        Data[i] = Column[i]        ; for reads
        Column[i] = Data[i]        ; for writes
    ELSE IF RepairVector[i] = 0 THEN
        Data[i] = Column[R]        ; for reads
        Column[R] = Data[i]        ; for writes
``` where i is a bit position index and R indicates the redundant column. It should be appreciated that other repair vector formats and/or byte aligned column redundancy procedures may alternatively be used.

In one approach, the location of a defective column in a memory array, if any, is determined during the manufacturing process. A corresponding repair vector, or an encoded version thereof, is then stored within the memory for later use. In at least one implementation, the repair vector (whether encoded or not) is stored within a dedicated non-volatile storage location within the memory. For example, as illustrated in FIG. 1, a storage location 52 may be provided within the array I/O 44 of memory 40 for storage of a repair vector. The stored repair vector may later be retrieved from the storage location 52 for use during memory access operations. If an encoded version of the repair vector is stored, an additional decoding operation maybe required to make use of the repair vector within the memory.

Figure 3A:
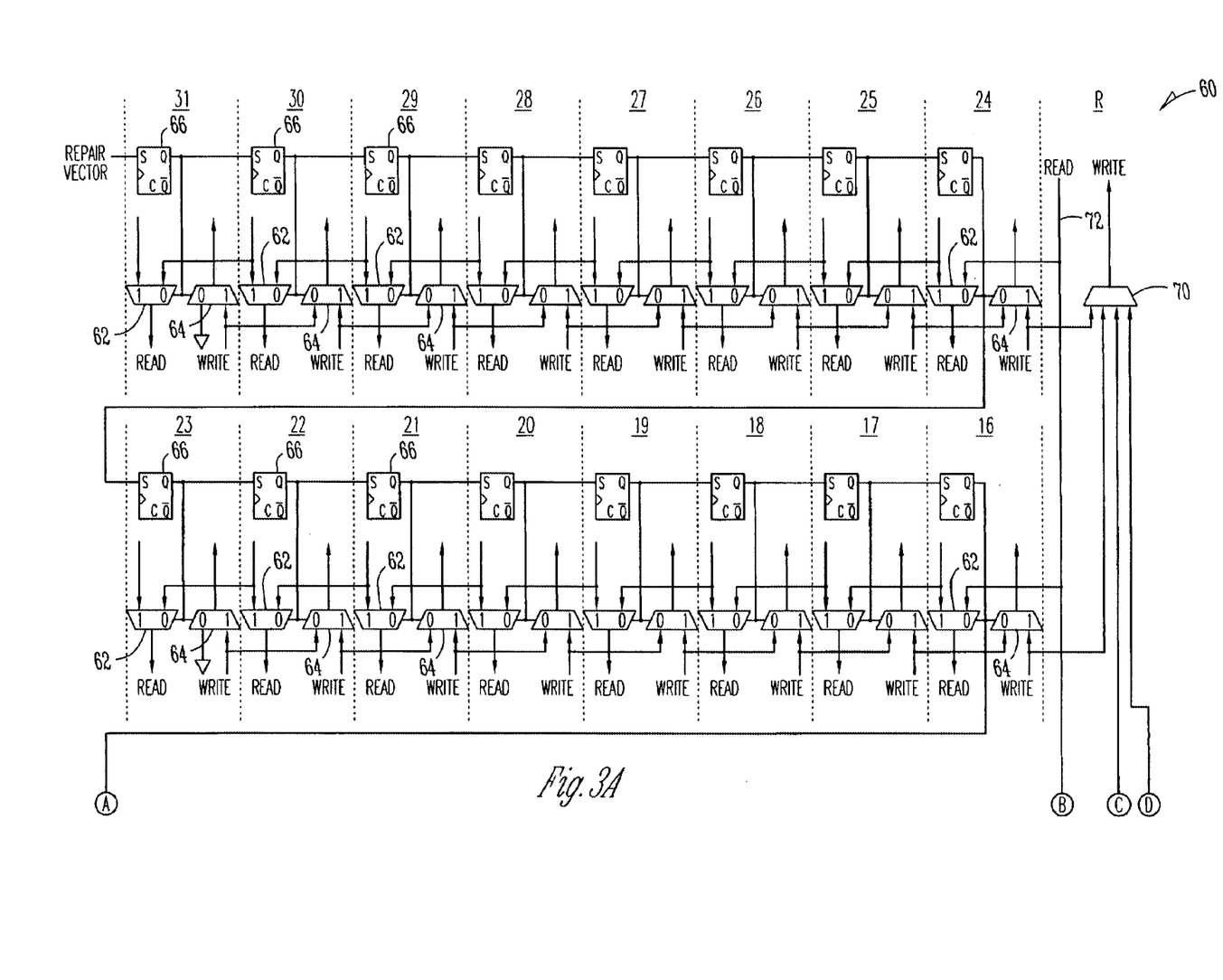
FIGS. 3A and 3B are a schematic diagram illustrating an apparatus for use in implementing byte-aligned redundancy in a memory in accordance with an embodiment of the present invention.
Figure 3B:
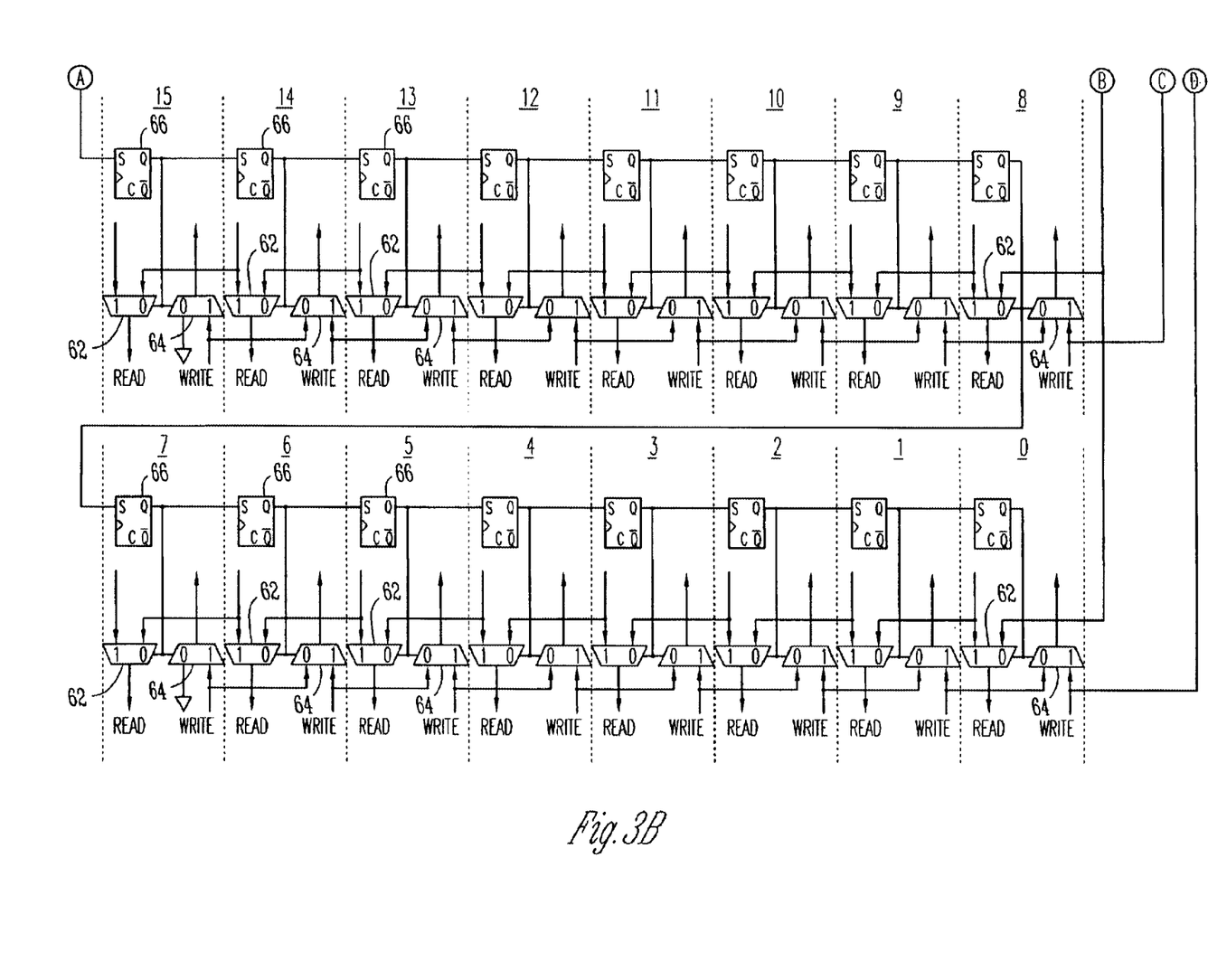

FIGS. 3A and 3B are a schematic diagram illustrating an apparatus 60 for use in implementing byte-aligned redundancy in a memory in accordance with an embodiment of the present invention. In the illustrated embodiment, the apparatus 60 is configured for use with a memory having a 32-bit word length, for example, memory 40 in FIG. 1, but the apparatus 60 may be easily modified for use with other memory sizes. The apparatus 60 may be implemented, for example, as part of the array I/O 44 of the memory 40 of FIG. 1. As illustrated, the apparatus 60 includes a read multiplexer 62, a write multiplexer 64, and a flip flop 66 for a column of the associated memory array (the columns are identified by numerals 31 through 0 in FIGS. 3A and 3B). The apparatus 60 also includes a redundant write multiplexer 70 for use in selecting a data bit to be written to the redundant column during a write operation. As discussed previously, the columns of the associated memory array may be divided into a number of column groups, a group defining an individual byte within a row. For example, columns 0–7 may define a first byte (BYTE[0]), columns 8–15 may define a second byte (BYTE[1]), columns 16–23 a third byte (BYTE[2]), and columns 24–31 a fourth byte (BYTE[3]). The flip flops 66 are arranged in a serial configuration to hold the repair vector during memory access operations. A flip flop 66 will hold, at an output thereof, the repair vector bit associated with the corresponding column. In one approach, the repair vector is shifted into the serially connected flip flop arrangement prior to memory operation. A bit of the repair vector is used to control the selection function of a corresponding read multiplexer 62 and write multiplexer 64. As the reader will appreciate, other structures and/or arrangements for holding the repair vector during memory operation may alternatively be used.

For a column of the memory that is not an LSB column (the LSB columns are columns 24, 16, 8, and 0 in the illustrated embodiment), the read multiplexer 62 has a first input coupled to receive a data bit read from the corresponding column and a second input coupled to receive a data bit read from the next lower column. During a read operation, the read multiplexer 62 will output the bit from the first input if the corresponding repair vector bit is "1" and the bit from the second input if the corresponding repair vector bit is "0".

For a column of the memory array that is not an MSB column (the MSB columns are columns 31, 23, 15 and 7 in the illustrated embodiment), the write multiplexer 64 has a first input coupled to receive a data bit from a byte of write data that has the same relative bit position as the corresponding column and a second input coupled to receive a data bit from the byte of write data that has the next higher, that is, namely, more significant, bit position. During a write operation, the write multiplexer 64 will output, for storage in the associated column, the bit from the first input if the corresponding repair vector bit is "1" (that is, namely, a redundant shift is not performed) and the bit from the second input if the corresponding repair vector bit is "0" (that is, namely, a redundant shift is performed). The write multiplexers 64 associated with the MSB columns may have a first input that is coupled as described above and a second input that is coupled to a fixed potential, for example, a ground potential in the illustrated embodiment.

The read multiplexers 62 that are associated with LSB columns may have a first input that is coupled to receive a data bit read from the corresponding column and a second input that is coupled to receive a data bit read from the redundant column. As illustrated in FIGS. 3A and 3B, a redundant read line 72 may be provided to carry the redundant read bit to the second input of a read multiplexer 62 associated with an LSB column. During a read operation, a read multiplexer 62 associated with an LSB column will output a data bit read from the corresponding column when the repair vector bit is "1" and a data bit read from the redundant column when the corresponding repair vector bit is "0."

As described above, the redundant write multiplexer 70 is operative for selecting a data bit to be written to the redundant column. As such, the redundant write multiplexer 70 will have one input corresponding to a byte of the memory. In the embodiment of FIGS. 3A and 3B, for example, the redundant write multiplexer 70 has a first input that is coupled to receive the LSB of a byte of write data being written to BYTE[0], a second input that is coupled to receive the LSB of a byte of write data being written to BYTE[1], a third input to receive the LSB of a byte of write data being written to BYTE[2], and a fourth input to receive the LSB of a byte of write data being written to BYTE[3]. The redundant write multiplexer 70 selects an input bit to be written to the redundant column based on the repair vector bits associated with the LSB columns, that is, namely, columns 24, 16, 8, and 0. That is, the redundant write multiplexer 70 will select the input bit associated with the LSB column that has a corresponding repair vector bit of "0." If none of the repair vector bits associated with the LSB columns are "0," then none of the input bits of the redundant write multiplexer 70 are selected.

In addition to selecting an appropriate bit to be written to the redundant column during a write operation, a redundant write enable needs to be generated to allow the selected bit to be written. In one approach, the redundant write enable is generated as follows:

Red_Write_En=(BYTE[0]Enable AND NOT(Repair_Vector_Bit[0])) OR (BYTE[1]Enable AND NOT(Repair_Vector_Bit[8])) OR (BYTE[2]Enable AND NOT(Repair_Vector_Bit[16])) OR (BYTE[3]Enable AND NOT(Repair_Vector_Bit[24])).

Figure 4:
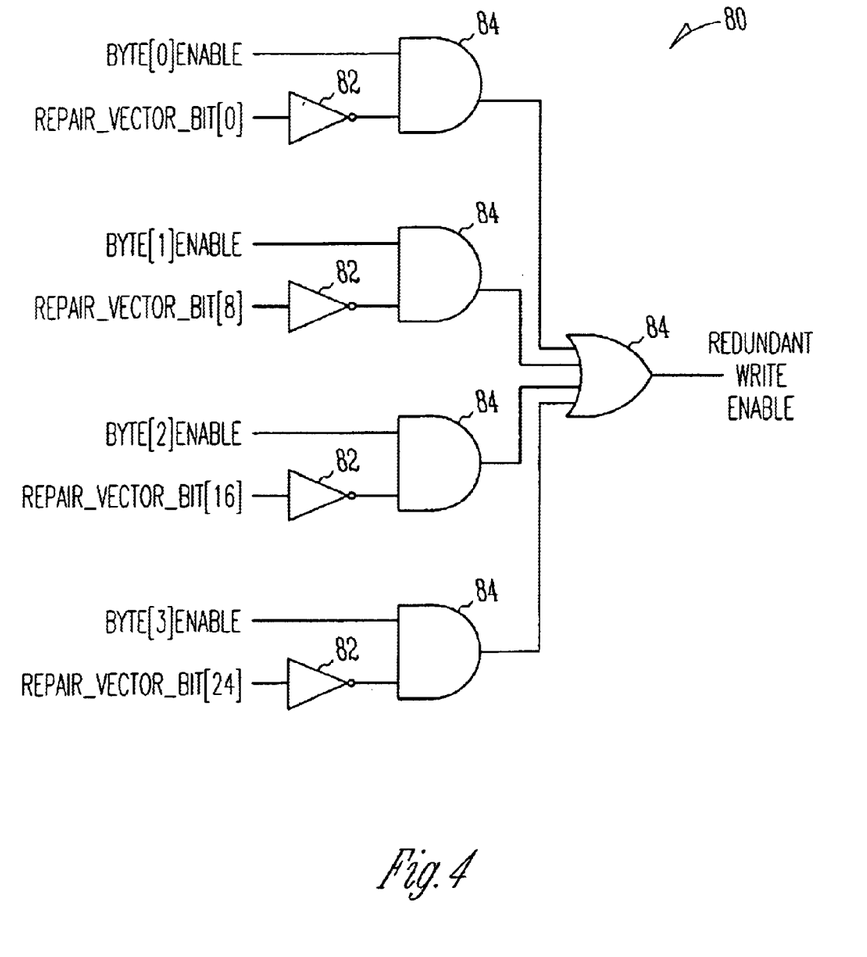
FIG. 4 is a schematic diagram illustrating circuitry for generating a redundant write enable in accordance with an embodiment of the present invention.

This enable may also be used as a redundant read enable for reading a data bit from the redundant column during a read operation. Using the above equation, the redundant column will only be enabled if one of the four bytes in the memory is enabled and the repair vector bit associated with the LSB column of the enabled byte is zero. FIG. 4 is a schematic diagram illustrating logic circuitry 80 that may be used to generate a redundant write (and/or read) enable based on the above equation. As shown, the circuitry 80 includes four inverters 82, four AND gates 84, and an OR gate 86.

Figure 5:
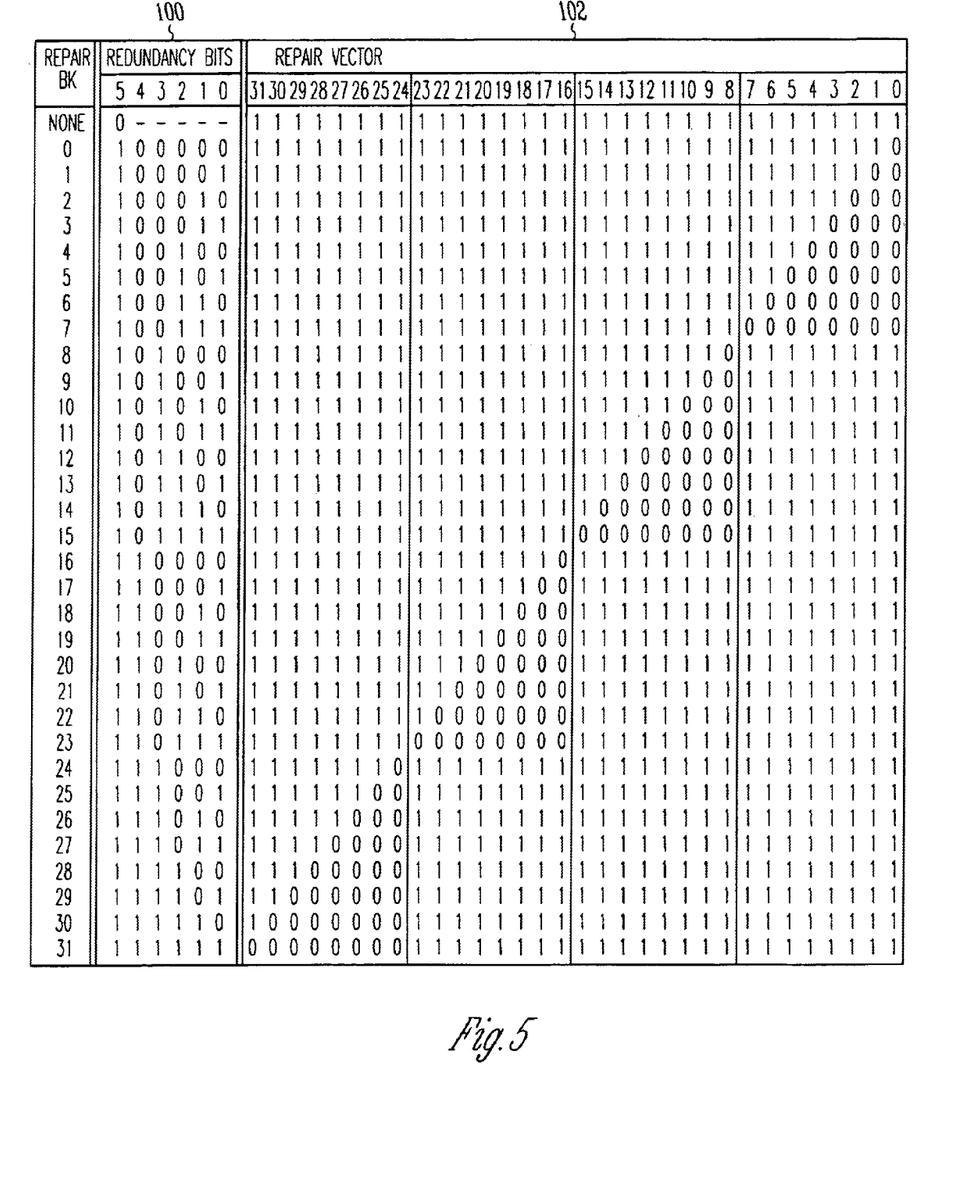
FIG. 5 is a table illustrating a family of encoded repair vectors that may be used to implement byte-aligned redundancy in accordance with an embodiment of the present invention.
Figure 6A:
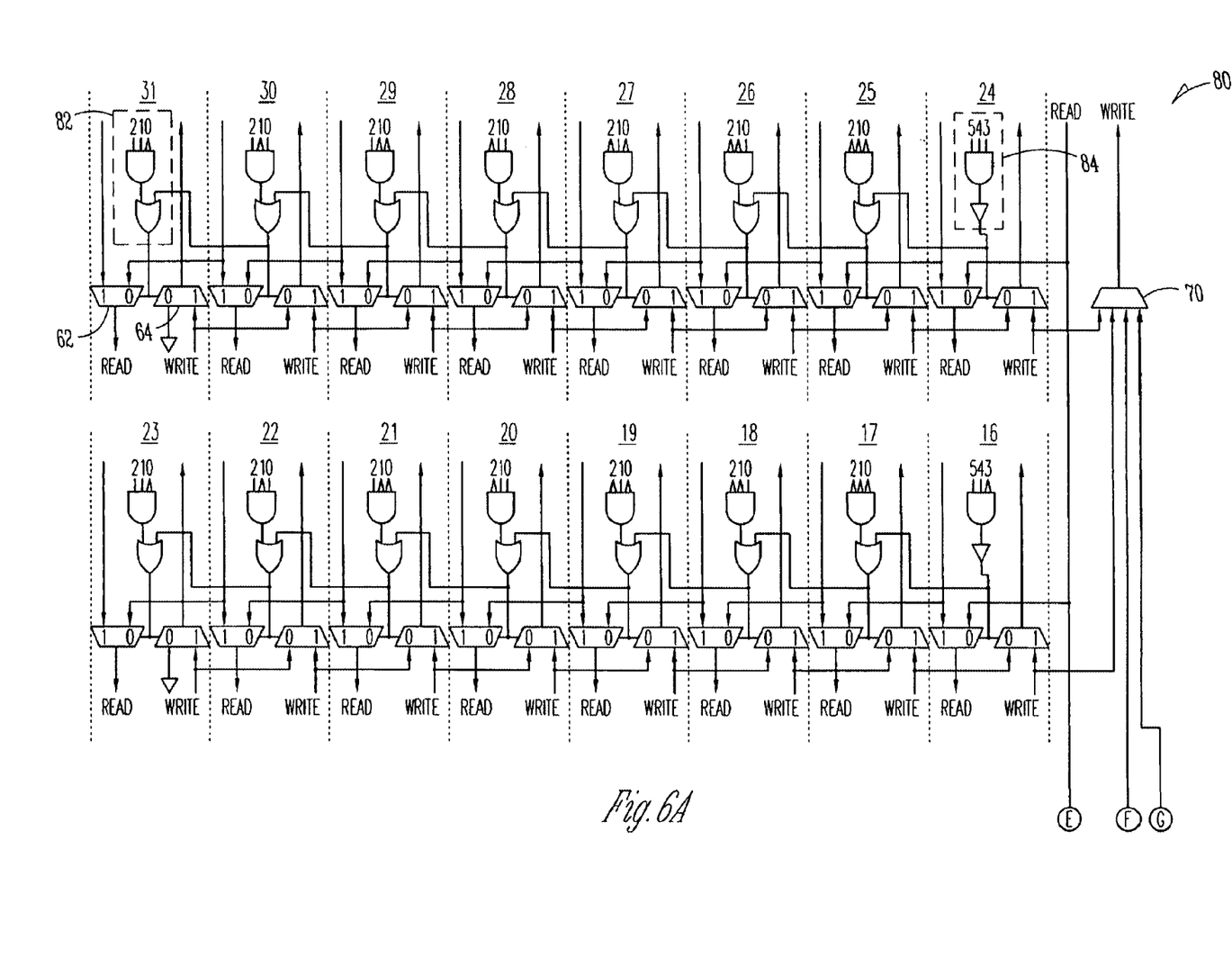
FIGS. 6A and 6B are a schematic diagram illustrating an apparatus for use in implementing byte aligned redundancy in a memory that includes decoding circuitry to decode an encoded repair vector in accordance with an embodiment of the present invention.
Figure 6B:
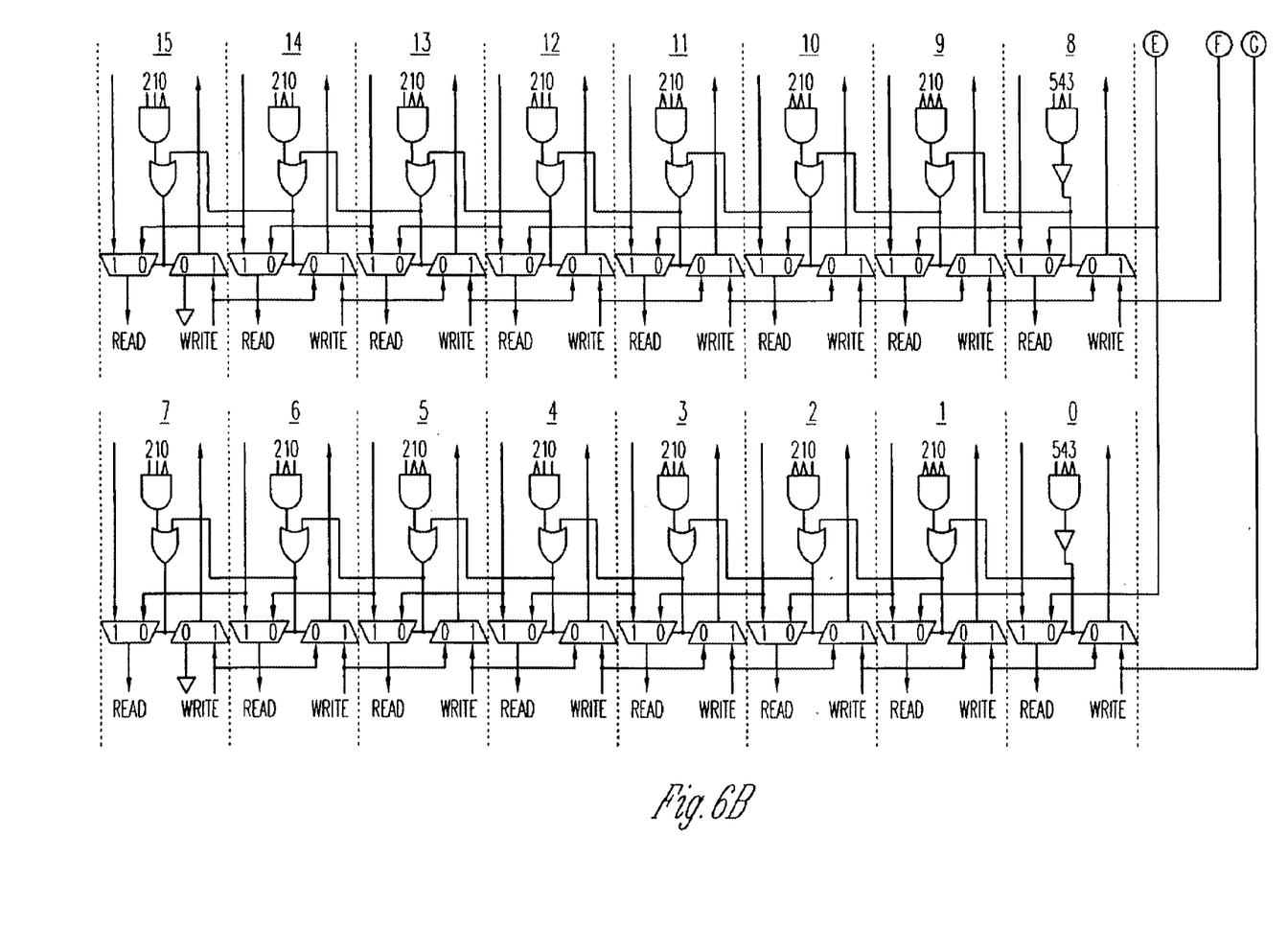

As described previously, a repair vector may be stored within a storage location in a memory in either an encoded or non-encoded form. The repair vectors illustrated in the table of FIG. 2 represent non-encoded repair vectors. FIG. 5 is a table illustrating a family of encoded repair vectors (see column 100 of the table) that may be used to implement byte-aligned redundancy in accordance with an embodiment of the present invention. As shown in FIG. 5, the encoded repair vectors are six bits in length and correspond to one of the non-encoded repair vectors discussed previously. In at least one embodiment of the invention, decoding circuitry is provided within a memory to decode an encoded repair vector stored therein for use in implementing byte aligned redundancy. FIGS. 6A and 6B is a schematic diagram illustrating an apparatus 80 for use in implementing byte-aligned redundancy that includes such decoding circuitry in accordance with an embodiment of the present invention. The apparatus 80 is similar to the apparatus 60 of FIGS. 3A and 3B, except for the manner in which the repair vector is handled. That is, instead of flip flops to hold the individual bits of a non-encoded repair vector, decoding circuitry 82, 84 is provided for a column of the memory array to decode an encoded repair vector (or a portion thereof) recorded within the memory to generate a corresponding bit of the non-encoded repair vector. The individual bits may then be used as described previously to control the selection function of the read multiplexers 62, the write multiplexers 64, and the redundant write multiplexer 70. In the illustrated embodiment, the decoding circuitry 82 associated with a non-LSB column includes a three input AND gate (with inverters on one or more inputs thereof, depending on column) and an OR gate. The decoding circuitry 84 associated with a LSB column includes a three input AND gate (with or without inverters on the inputs thereof) and an inverter to invert the output of the AND gate. The inputs of the AND gates in the decoding circuitry 82, 84 receives a specific bit of the encoded repair vector (labeled 0 through 5 in FIGS. 6A and 6B). As will be apparent to persons of ordinary skill in the art, the decoding circuitry 82, 84 of FIGS. 6A and 6B will generate the non-encoded repair vectors of column 102 in the table of FIG. 5 when acting upon the corresponding encoded repair vectors of column 100 of the table. The above described repair vector decoding scheme can be easily modified for use with memories having other data word lengths. Other repair vector encoding/decoding schemes may alternatively be used.

Figure 7:
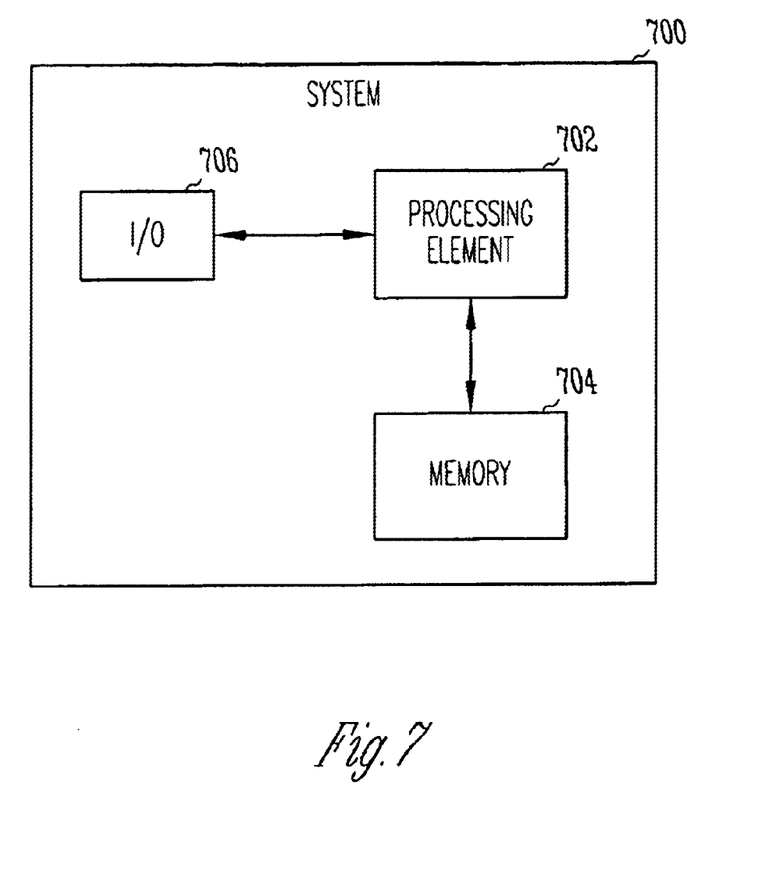
FIG. 7 is a block diagram of a system in accordance with an embodiment of the present invention.

FIG. 7 is a block diagram of a system in accordance with an embodiment of the present invention. System 700 may be almost any processing system, such as a personal computer or server, or a communication system including a wireless communication device or system. Examples of wireless devices may include personal digital assistants (PDAs), laptop and portable commuters with wireless communication capability, web tablets, wireless telephones, wireless headsets, pagers, instant messaging devices, MP3 players, digital cameras, and other devices that may receive and/or transmit information wirelessly. System 700 includes a processing element 702, memory 704 and system I/O 706. Processing element 702 may be any type of processing element that utilizes a memory, and may include a digital signal processor (DSP), a microprocessor or a microcontroller. Memory 704 may support processing element 702, and in one embodiment, may provide a cache memory for processing element 702. In one embodiment, memory 40 (FIG. 1) may be suitable for use as memory 704. In this embodiment, memory 704 may have a redundant column used to repair a defective column in a byte-aligned manner. I/O 706 may support the input and output requirements of system 700 and may include any I/O elements such as, for example, a keyboard, a keypad, a speaker, a microphone, a display, an antenna, a port, etc., depending on the purpose of system 100.

In the above-described embodiments, the inventive principles are discussed in the context of memories providing byte access capabilities. It should be appreciated that the inventive principles may also be implemented in memory designs that provide individual access to data segments other than data bytes. For example, a memory that provides individual access to half-bytes of data, that is, namely, nibbles within a row may also implement the inventive principles (in which case the column replacement would be done on a nibble by nibble basis).

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A memory comprising:
    a memory array having rows and columns, rows of the memory array to store a data word, the memory array having a number of column groups that define a predetermined amount of data storage space within a row, the column groups including at least a first column group and a second column group, the memory array including a repair column for use in repairing the memory when another column of the memory array is defective; and
    a write multiplexer to select, when a defective column is present in the memory array, an input data bit to be written to the repair column, the write multiplexer having a first input corresponding to the first column group and a second input corresponding to the second column group.

2. The memory of claim 1, wherein the write multiplexer is a redundant write multiplexer, and wherein:
    the first input of the redundant write multiplexer is coupled to receive a least significant bit of write data associated with the first column group and the second input of the redundant write multiplexer is coupled to receive a least significant bit of write data associated with the second column group.

3. The memory of claim 1, wherein the write multiplexer is a redundant write multiplexer, and wherein:
    the first input of the redundant write multiplexer is coupled to receive a most significant bit of write data associated with the first column group and the second input of the redundant write multiplexer is coupled to receive a most significant bit of write data associated with the second column group.

4. The memory of claim 1, wherein the write multiplexer is a redundant write multiplexer, and wherein:
    the redundant write multiplexer includes an individual input for a column group in the memory array.

5. The memory of claim 1, wherein the write multiplexer is a redundant write multiplexer, and wherein:
    the redundant write multiplexer is configured to select an input data bit that corresponds to a column group that includes a defective column.

6. The memory of claim 1, wherein the write multiplexer is a redundant write multiplexer, and wherein the memory further comprises:
    a redundant read line to carry a bit of data read from the repair column, the redundant read line being coupled to an input of a first read multiplexer associated with the first column group and an input of a second read multiplexer associated with the second column group.

7. The memory of claim 6, wherein:
    the first read multiplexer corresponds to a least significant bit column of the first column group and the second read multiplexer corresponds to a least significant bit column of the second column group.

8. The memory of claim 6, wherein:
    the first read multiplexer corresponds to a most significant bit column of the first column group and the second read multiplexer corresponds to a most significant bit column of the second column group.

9. The memory of claim 6, wherein:
    the memory array includes more than two column groups, wherein the redundant read line is coupled to an input of a read multiplexer associated with the more than two column groups.

10. The memory of claim 1, wherein the write multiplexer is a redundant write multiplexer, and wherein the memory further comprises:
    a storage location to store a repair vector for use in operating the memory, wherein the redundant write multiplexer selects an input data bit to be written to the repair column based on the repair vector.

11. The memory of claim 9, wherein:
    the repair vector stored in the storage location is encoded, the memory further comprising decoding circuitry to decode the repair vector.

12. The memory of claim 1, wherein:
    the predetermined amount of data storage space includes a byte of data storage space.

13. A memory comprising:
    a memory array having rows and columns, rows of the memory array to store a data word, the memory array having a number of column groups that define a predetermined amount of data storage space within the rows, the column groups including at least a first column group and a second column group, the memory array including a repair column for use in repairing the memory when another column of the memory array is defective; and
    a repair read line to receive a bit of data read from the repair column, the repair read line being coupled to an input of a first read multiplexer associated with the first column group and an input of a second read multiplexer associated with the second column group.

14. The memory of claim 13, wherein:

the first read multiplexer corresponds to a least significant bit column of the first column group and the second read multiplexer corresponds to a least significant bit column of the second column group.

15. The memory of claim 13, wherein:

the first read multiplexer corresponds to a most significant bit column of the first column group and the second read multiplexer corresponds to a most significant bit column of the second column group.

16. The memory of claim 13, wherein:

the memory array includes more than two column groups, wherein the repair read line is coupled to an input of a read multiplexer associated with the more than two column groups.

17. The memory of claim 13, comprising:

a redundant write multiplexer to select, when a defective column is present in the memory array, a data bit to be written to the repair column, the redundant write multiplexer having a first input corresponding to the first column group and a second input corresponding to the second column group.

18. The memory of claim 13, comprising:

a storage location to store a repair vector for use in operating the memory, wherein the first read multiplexer selects an input data bit to be output by the first read multiplexer based on the repair vector.

* * * * *